(12) United States Patent
Ackerman et al.

(10) Patent No.: US 6,535,532 B1
(45) Date of Patent: *Mar. 18, 2003

(54) METHOD AND APPARATUS TO SELECT OPTIMAL OPERATING CONDITIONS IN A DIGITAL WAVELENGTH STABILIZED CONTROL SYSTEM

(75) Inventors: David Alan Ackerman, Hopewell, NJ (US); Scott L. Broutin, Maxatawny Township, PA (US); James K. Plourde, Allentown, PA (US); John W. Stayt, Jr., Schnecksville, PA (US)

(73) Assignees: Agere Systems Inc, Allentown, PA (US); TriQuint Semiconductor Inc, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/475,606

(22) Filed: Dec. 30, 1999

(51) Int. Cl.[7] .................................................. H01S 3/13
(52) U.S. Cl. ...................... 372/32; 372/20; 372/29.011; 372/29.015

(58) Field of Search .............................. 372/20, 29.011, 372/29.015, 32, 96

(56) References Cited

U.S. PATENT DOCUMENTS

| | | | | |
|---|---|---|---|---|
| 4,897,843 A | * | 1/1990 | Scott ............................ | 372/20 |
| 5,359,613 A | * | 10/1994 | Mols et al. .................... | 372/20 |
| 5,579,327 A | * | 11/1996 | Ohtateme et al. ............. | 372/20 |
| 5,594,748 A | * | 1/1997 | Jabr ........................ | 372/38.09 |
| 5,825,792 A | * | 10/1998 | Villeneuve et al. ........... | 372/32 |
| 6,064,681 A | * | 5/2000 | Ackerman .................... | 372/32 |

* cited by examiner

*Primary Examiner*—Paul Ip
*Assistant Examiner*—James Menefee

(57) ABSTRACT

A method for controlling tuning current values provided to a multichannel laser source. For each operating laser channel, a desired slope value of laser power as a function of tuning current is stored. The slope values of laser power as a function of tuning current is then measured. The tuning current is then adjusted until a slope value substantially close to said desired slope value is measured. The operating tuning current is set for the laser source that corresponds to the measured slope value.

16 Claims, 4 Drawing Sheets

METHOD AND APPARATUS TO SELECT OPTIMAL OPERATING CONDITIONS IN A DIGITAL WAVELENGTH STABILIZED CONTROL SYSTEM

FIELD OF THE INVENTION

This invention relates to semiconductor lasers and more specifically to a control system for selecting optimal operating conditions in multichannel laser sources.

BACKGROUND OF THE INVENTION

An ever increasing need for information transmission has led to an increase in optical transmission systems. Optical transmission sources, such as lasers are becoming more and more complex. Recent advances in wavelength division multiplexing (WDM) and dense wavelength division multiplexing (DWDM) require accurate wavelength lasers that are capable to function in multi-channel transmission arrangements.

In a dense wavelength division multiplexed optical network, multiple channels of different frequency or wavelength are coupled to a single optical fiber so as to increase the information capacity carried through the system. The channel density of such networks has increased dramatically resulting in narrower frequency spacing between channels. The frequency or channel spacing is narrowing from a typical 100 GHz range to about 50 GHz and even 25 GHz range.

One family of semiconductor laser that is used in such multi-channel transmission arrangements is known as distributed Bragg reflector laser (DBR), which is capable of generating a plurality of lights with desired wavelengths with a narrow channel spacing. A DBR laser has a laser cavity situated between two reflective surfaces. A tuning current signal is provided to one or both reflective surfaces to change the index of refraction, which in turn varies the wavelength of the laser light generated by the DBR.

In a multichannel laser system such as one that employs a DBR laser, it is important to control laser side mode suppression ratio (SMSR) at a desired level, so as to prevent cross-talk and transmission error. Typically, for each channel of the DBR laser a ratio of −30 to −40 dB suppression is necessary for ensuring proper transmission. However, within each desired channel, there are tuning current signal values that can cause the suppression ratio to decrease dramatically. As such, prior art systems do not typically use DBR lasers in order to vary laser wavelength. Rather, a plurality of distributed feedback, DFB, lasers are employed, with each one tuned to a desired wavelength.

Some prior art systems that have attempted to control laser side mode suppression ratio (SMSR) employ analog techniques based on generating a second harmonic tone from an analog tone that is superimposed onto the laser drive current. This technique may cause transmission errors in certain applications, and therefore is not desirable.

Thus, there is a need for a control system for a multichannel laser source, such as a DBR laser, that maintains a desired operating point within each wavelength channel.

SUMMARY OF THE INVENTION

In accordance with one embodiment of the invention, a control system in a multichannel laser controls the tuning current provided to the laser source by measuring the slope values of laser power as a function of tuning current. The laser power may be measured at its front face, where the generated light is directed to an optical fiber, or in the alternative, may be preferably measured at its back face, where portion of the emitted light can be measured. The tuning current is then varied until the system measures a desired slope value. The desired slope value relates to an area of the curve, representing the laser power, preferably backface power, versus tuning current, that assures an acceptable laser side mode suppression ratio, or other optimal operating parameters. In accordance with another embodiment of the invention, the control system also ensures that the laser source is operating so as to provide a desired frequency.

In accordance with another embodiment of the invention, a microprocessor-based control system is employed. A look-up table stores all desired slope values for each operating channel. The desired slope values are measured in advance, based on the characteristics of the laser source. Thereafter, an optical discriminator is employed to provide the laser power source value and the frequency of the light source to the microprocessor. The microprocessor provides an increment in tuning current over several iterations, so that the average slope values of the laser backface power source is calculated. The system then determines which value of tuning current corresponds to a slope closest to the look-up table slope value for a specified channel, and slowly steps the tuning current to the desired value.

The control system in accordance with the present invention allows multichannel optical laser sources, such as DBR lasers to operate flexibly over a wide range of available channels, while avoiding operating points that experience low side mode suppression ratio or other undesired operating parameters.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE DRAWINGS

Figure 1:
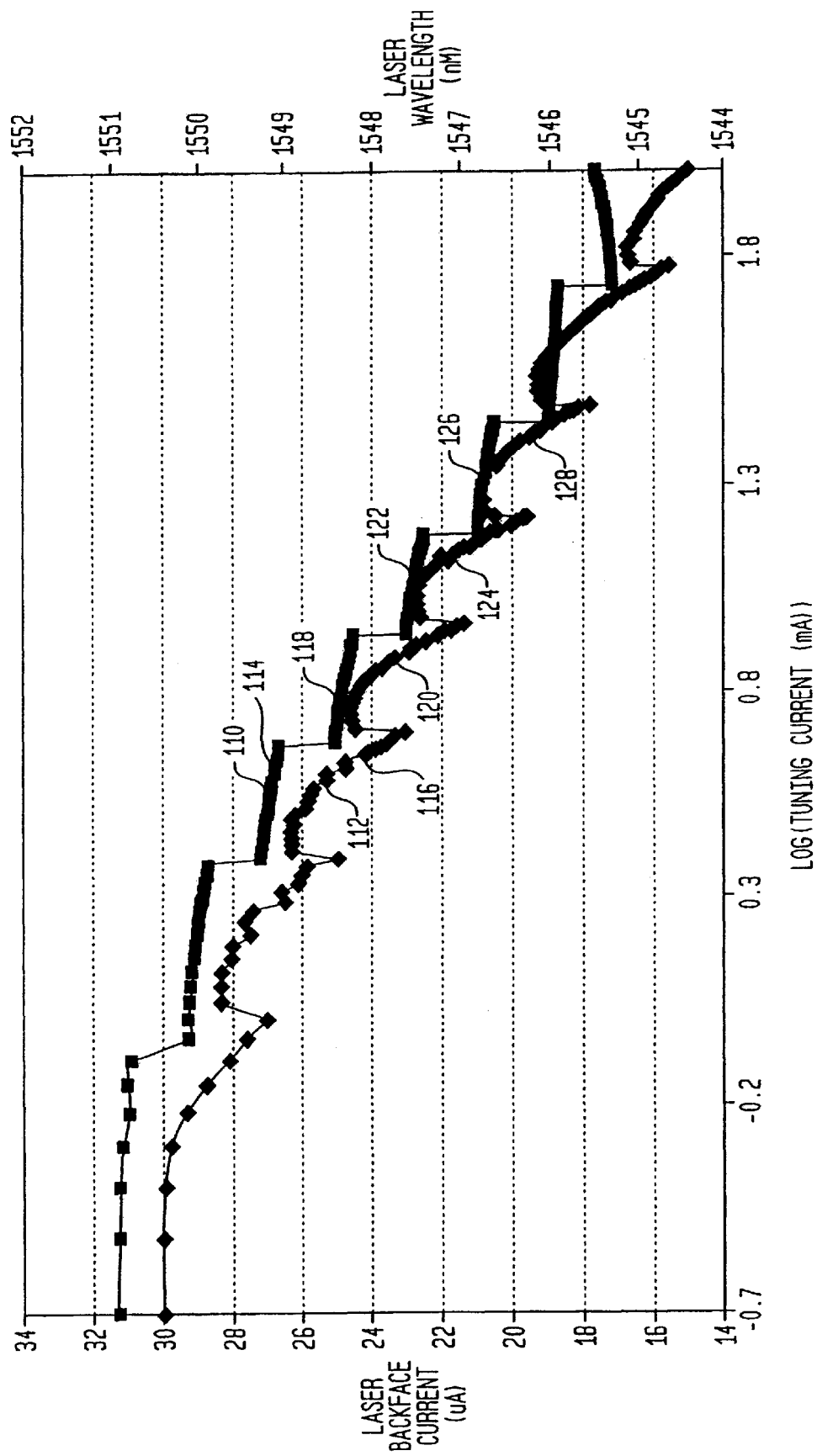
FIG. 1 illustrates a plot of laser wavelengths and laser back face current as a function of tuning current in a distributed Bragg reflective (DBR) in accordance with one embodiment of the present invention.

FIG. 1 illustrates two plots 110 and 112 that relate to the characteristics of a distributed Bragg reflective (DBR) laser in accordance with one embodiment of the present invention. As illustrated plot 110 represents laser wavelength values as a function of a tuning current on a log scale. The DBR laser exhibiting the characteristics illustrated in FIG. 1 provides laser beams with relatively fixed wavelengths for a specified range of tuning current. Thus, step 114 of curve 110 represents one channel of the laser source, which corresponds to a relatively fixed wavelength, for example, around 1549 nm. Step 118 of curve 10 represents another channel of the laser source, which corresponds to a relatively fixed wavelength, for example, around 1548 nm. Similarly, steps 122 and 126 of curve 110 represent other channels of the laser source, which respectively correspond to a relatively fixed wavelength for example, around 1547 nm and 1546 nm.

As the tuning current changes, the wavelength of the light source varies also. The wavelength variation within each channel is relatively small, whereas the variation from one channel to the other is more significant. In accordance with one embodiment of the invention, a control system for generating a desired tuning current provides for the operation of the laser source at specified locations along each channel defined by plot 110. These specified locations may be advantageously selected so as to decrease transmission errors, such as bit error rate, dispersion, and frequency chirp, as well as to increase side mode suppression to acceptable levels. The dynamic shift of lasing frequency, under modulation, is refereed to as frequency chirp.

FIG. 1 also illustrates plot 112, which represents laser power values as a function of a tuning current on a log scale. It is noted that the laser power is actually represented by, in this example, the laser back face current in $\mu A$. The DBR laser exhibiting the characteristics illustrated in FIG. 1 provides a power curve with abrupt changes around the tuning currents that correspond to a different channel. Thus, portion 116 of curve 112 represents one channel of the laser source, which corresponds to a relatively fixed wavelength, for example, around 1549 nm. Portion 120 of curve 112 represents another channel of the laser source, which corresponds to a relatively fixed wavelength, for example, around 1548 nm. Similarly, portions 124 and 128 of curve 112 represent other channels of the laser source, which respectively correspond to a relatively fixed wavelength for example, around 1547 nm and 1546 nm. These wavelengths may be altered by temperature tuning of the laser.

Figure 2:
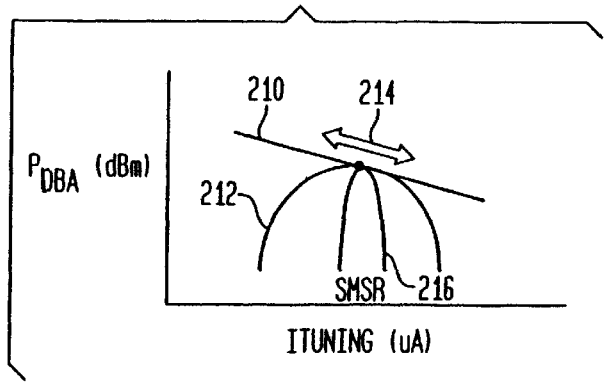
FIG. 2 illustrates, a plot of laser power output values as a function of tuning current within one of the operating channels illustrated in FIG. 1 in accordance with one embodiment of the present invention.

FIG. 2 illustrates an exemplary plot 212 of laser backface power output values as a function of tuning current within one of the operating channels illustrated in FIG. 1 in accordance with one embodiment of the present invention. As illustrated, it is possible to measure the slope dp/di, 210, of curve 212 at various tuning current values moving up and down the power curve as represented by arrow 214. Advantageously, desired slope values dp/di can be stored for corresponding desired laser characteristics, such as an optimum side mode suppression ratio for each channel as illustrated by side mode suppression ratio curve 216, although the invention is not limited in scope in this aspect. For example, desired slope values can also be stored for other laser characteristics, such as dispersion, bit error rate, and frequency chirp. Thereafter, during the operation of the multichannel laser, slope values dp/di may be measured while the tuning current is varied until the desired slope value dp/di is detected. The laser control mechanism attempts to maintain the wavelength corresponding to the desired slope value via, for example, a temperature and wavelength feedback loop as will be explained in more detail below.

Figure 3:
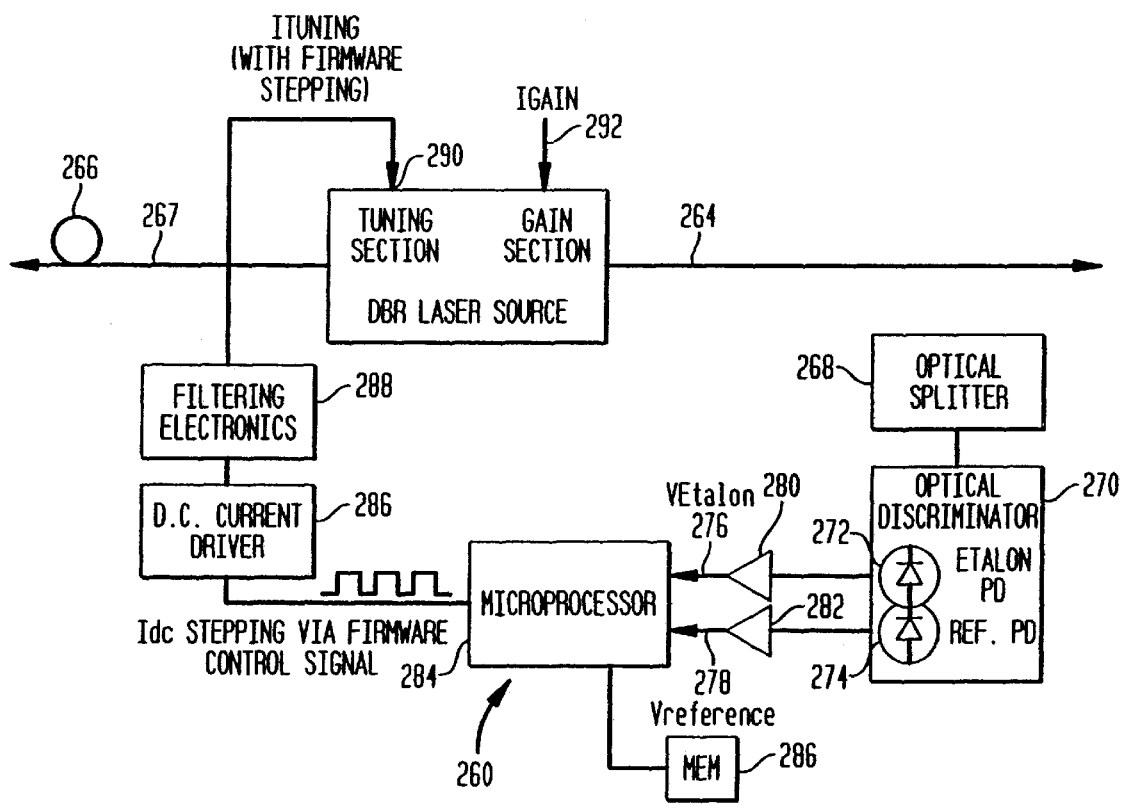
FIG. 3 illustrates a block diagram of a DBR laser control system in accordance with one embodiment of the present invention.

FIG. 3 illustrates a block diagram of a DBR laser control system 260 in accordance with one embodiment of the present invention. A DBR laser source 262 provide a laser light 267 for example to an optical fiber 266. An optical splitter 268 receives a substantial small portion of light 264 to employ a feedback system as explained below.

Optical splitter 268 provides the portion of the light that it has received from laser source 262, to an optical discriminator 270. The operation of optical discriminator 270 is described, for example, in a patent application filed on Jun. 7, 1999, by the same assignee as the present invention, docket no. Ackerman 17-3-13-10 and is incorporated herein by reference. Basically, optical discriminator 270 includes an etalon photo-detector filter 272 and a reference photodetector 274, respectively providing an etalon output signal 276 and a reference output signal 278, via amplifiers 280 and 282. Reference output signal 278 is proportional, among other things, to the power of laser light generated by laser source 262. Furthermore, the etalon output signal 276 is proportional, among other things, to the power and wavelength of laser light generated by laser source 262. Furthermore, it is possible to indirectly estimate the wavelength of the light generated by laser source 262 by employing the values of etalon and reference output signals as taught in the above-identified application as incorporated herein.

A microprocessor 284 is configured to receive etalon output signal 276 and reference output signal 278, although the invention is not limited in that respect. For example, control system 260 in accordance with other embodiments of the invention employs other type of processors such as microcontrollers, field programmable gate arrays and other type of hardware and firmware. Microprocessor 284 includes a memory 286 configured to store, among other things, program operation and various look-up tables relating to the operation of control system 260.

In accordance with one embodiment of the present invention, memory 286 includes a plurality of look-up tables each relating to one of the channels that laser source 262 may operate. Each look-up table includes a plurality of slope values corresponding to the light power generated by the laser as a function of the tuning current for each specific operating temperature. Desired slope values are also selected for each channel so as to control the operating tuning current signal to maintain values that correspond to the desired slope values.

Microprocessor 284 generates a stepping tuning current signal $I_{DC}$ to a DC current driver 286. The output signal of current driver 286 is in turn provided to a tuning current electrode 290 of laser source 262 via a conditioning circuit 288. Laser 262 also includes a gain section configured to receive a gain current signal 292. It is noted that etalon and reference signals 276 and 278 may be obtained from either the laser light provided to the output portion of laser 262 or the laser light provided to what is known as the back face of the laser source. Preferably, the light at the back face is measured in accordance with one embodiment of the invention, since this light is not modulated: the light provided by the output portion of laser 262 is modulated in some applications.

Figure 4:
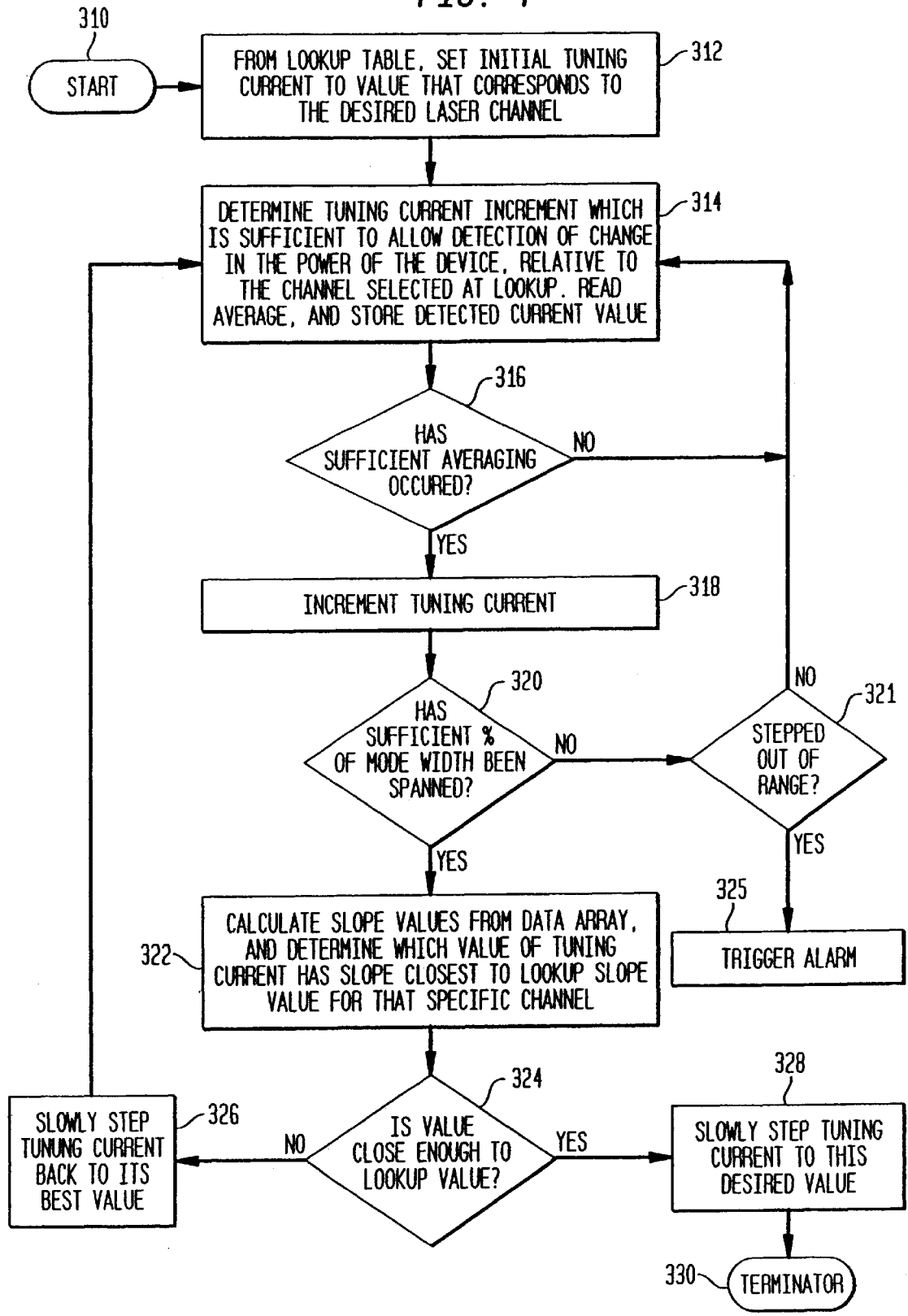
FIG. 4 illustrates a flow chart of a control system for operating a DBR laser in accordance with one embodiment of the present invention.

FIG. 4 is a flow chart illustrating a process to control the tuning current of a multi-channel laser source that employs a control system 260 in accordance with one embodiment of the present invention. At step 310 the control system begins its operation. The system then goes to step 312 to retrieve an initial tuning current value from one of the lookup tables stored in memory 286 that correspond to a desired laser channel. Microprocessor 284 in turn sets the initial tuning current to this retrieved value.

Thereafter, at step 314, microprocessor 284 varies the tuning current value in a stepping arrangement in sufficient increments so as to detect change in laser light power. It is noted that for each of the laser channels, the increments may be different. Microprocessor 284 measures the output power values for a specifiable period of time and calculates an average output power value. To this end, at step 316, microprocessor 284 determines whether sufficient averaging has occurred. If so, the system goes to step 318. Otherwise it goes back to step 314 to obtain additional power values for average measurement.

At step 318, microprocessor 284 increments the tuning current value. At step 320 the system determines whether a specifiable portion of the operating channel has been spanned. This portion is preferably around 5–10% of the entire channel, in order to assure enough signal to noise ratio on the slope calculation, although the invention is by no means limited in that respect. If however, the tuning current values generated by microprocessor 284 have not spanned a sufficient portion of tuning current range for the operating channel, the system goes to step 321 to determine whether the system has stepped out of range. If so, the system triggers an alarm at step 325 for corrective action. Otherwise the system goes back to step 314 and repeats the power measurements described in reference with steps 314 and 316 for the new incremented tuning current, otherwise, the steps goes to step 322.

At step 322 the system calculates the slope values for the portion of the power curve spanned by varying the tuning current. The calculated slope values are then compared with the desired slope value that corresponds to the desired operating point along the power curve, such as curve 212 illustrated in FIG. 2. The slope value closest to the desired slope value is then selected. At step 324 the system determines whether this slope value is sufficiently close to the desired slope value as specified by design considerations of the system. Thus, the decision at step 324 can be based, among other things on the required system accuracy.

If at step 324 the system determines that the slope value is sufficiently close to the desired slope value the system goes to step 328 and microprocessor 284 slowly steps to the tuning current value that corresponds to this desired slope value. Otherwise, the system goes to step 326 and microprocessor 284 slowly steps to the best available tuning current value. The system then goes to step 314 and repeats the operation described above again.

Figure 5:
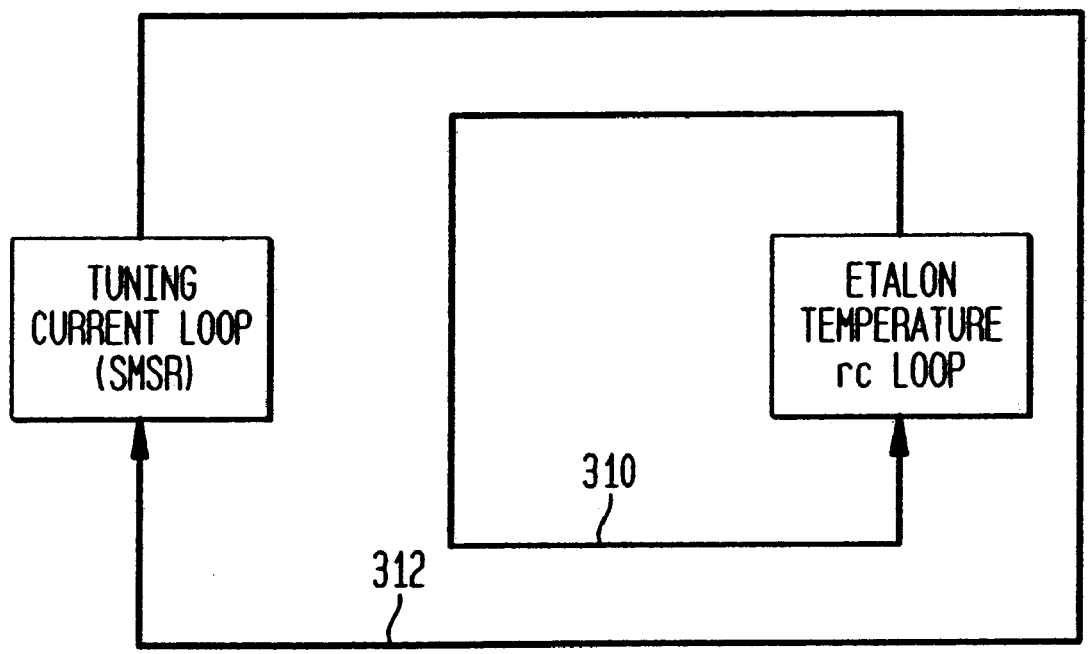
FIG. 5 illustrates a combined operation of a temperature control loop and a tuning current control loop in accordance with one embodiment of the present invention.

It is noted that while control system 260 controls the tuning current value based on the measured power of the laser source, a separate temperature control loop of control system 260 operates to constantly adjust the operating temperature of the laser source so as to maintain the wavelength generated by the laser source at a desired value. The temperature control loop operates based on the wavelength variations as detected by etalon photodetector 272. The system attributes the wavelength variations to operating temperature of the laser. The temperature control loop derived from optical discriminator 270 has a faster time constant than the turning current control loop illustrated in FIG. 3. FIG. 5 illustrates the combined operation of the temperature control loop 310 and the tuning current control loop 312 in accordance with one embodiment of the present invention.

Thus, in accordance with the principles of the present invention, it is possible to move the operating point of a multi-channel laser source based upon a desired slope value of laser power values represented as a function of tuning current values. This control mechanism allows a laser source to operate with optimal side mode suppression ratio values, dispersion and frequency chirp requirements.

We claim:

1. A method for controlling tuning current values provided to multichannel laser source comprising the steps of:

(a) for each operating laser channel, storing a desired slope value of laser power as a function of tuning current;

(b) measuring slope values of laser power as a function of tuning current for each said channel;

(c) varying the tuning current across the width of each said channels until a slope value substantially close to said desired slope value for each channel is measured; and (d) setting an operating tuning current for said laser source for each of said channels that corresponds to said measured slope value.

2. The method according to claim 1 further comprising the step of allocating tuning current increments corresponding to each channel of said multichannel laser source.

3. The method according to claim 1 wherein for each tuning current value set at said step (c), the method further comprises the step of averaging slope values measured for each of said tuning current values.

4. The method according to claim 3 further comprising the step of incrementing said tuning current value over a specifiable portion of each of said channels of said multichannel laser source.

5. The method according to claim 4 further comprising the step of measuring the power of said laser source by routing a portion of laser light generated by said laser source to an optical discriminator.

6. The method according to claim 5 further comprising the step of generating an etalon output signal and a reference output signal corresponding to frequency and power of laser light generated by said laser source.

7. The method according to claim 4 further comprising the step of controlling operating temperature of said laser source.

8. A microprocessor control system for generating tuning current values employed by a multichannel laser source comprising:

(a) a lookup table memory configured to store, for each operating laser channel, a desired slope value of laser power as a function of tuning current;

(b) a microprocessor coupled to said lookup table, configured to measure slope values of laser power as a function of tuning current for each of said channels; and (c) a tuning current generator configured to provide a plurality of tuning current signals until a slope value substantially close to said desired slope value is measured for each of said channels such that said microprocessor can set an operating tuning current for said laser source for each of said channels that corresponds to said measured slope value.

9. The system according to claim 8 wherein said microprocessor allocates specified tuning current increments corresponding to each channel of said multichannel laser source.

10. The system according to claim 8 wherein said microprocessor calculates an average slope value measured for each of said tuning current values.

11. The system according to claim 10 wherein said slope values are measured corresponding to a specifiable range of tuning current values within each of said channels of said multichannel laser source.

12. The system according to claim 11 further comprising an optical discriminator coupled to said laser light source so as to measure the power of said laser source.

13. The system according to claim 12 wherein said optical discriminator further comprises an etalon photo detector and a reference photo detector configured to generate an etalon output signal and a reference output signal corresponding to frequency and power of laser light generated by said laser source.

14. The system according to claim 13 further comprising a temperature feedback loop for maintaining the operating temperature of said laser source.

15. The method according to claim 1 wherein said desired slope values correspond to optimum slope values for controlling any one of the side mode suppression ratio, dispersion, bit error rate and frequency chirp.

16. The method according to claim 8 wherein said desired slope values correspond to optimum slope values for controlling any one of the side mode suppression ratio, dispersion, bit error rate and frequency chirp.

* * * * *